US011115004B1

(12) United States Patent
Stanley et al.

(10) Patent No.: US 11,115,004 B1
(45) Date of Patent: Sep. 7, 2021

(54) FRACTIONAL DELAY FILTER FOR A DIGITAL SIGNAL PROCESSING SYSTEM

(71) Applicant: HONEYWELL FEDERAL MANUFACTURING & TECHNOLOGIES, LLC, Kansas City, MO (US)

(72) Inventors: Dennis L. Stanley, Kansas City, MO (US); Audrey L. Chritton, Kansas City, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 0 days.

(21) Appl. No.: 16/985,884

(22) Filed: Aug. 5, 2020

(51) Int. Cl.
*H03H 17/00* (2006.01)
*H03H 17/02* (2006.01)
*H04L 7/00* (2006.01)

(52) U.S. Cl.
CPC ...... *H03H 17/0018* (2013.01); *H03H 17/028* (2013.01); *H04L 7/0029* (2013.01); *H03H 2017/0072* (2013.01)

(58) Field of Classification Search
CPC ...... H03H 11/00; H03H 11/265; H03H 17/00; H03H 17/0018; H03H 17/028; H03H 2017/00; H03H 2017/0072; H04L 7/00; H04L 7/0029; H03K 5/00; H03K 5/13; H03K 5/132; H03K 5/133; H03K 5/135
USPC ....................................................... 327/261
See application file for complete search history.

(56) References Cited

U.S. PATENT DOCUMENTS

| | | | |
|---|---|---|---|
| 5,812,608 A | * | 9/1998 | Valimaki ............ H03H 17/028 348/538 |
| 7,697,641 B2 | | 4/2010 | Haddadin et al. |
| 7,773,692 B2 | | 8/2010 | Copeland et al. |
| 8,046,199 B2 | | 10/2011 | Copeland |
| 8,289,195 B1 | | 10/2012 | Dong et al. |
| 9,178,683 B2 | | 11/2015 | Varma et al. |
| 2002/0152250 A1 | | 10/2002 | Staszewski |
| 2016/0097846 A1 | | 4/2016 | Mortensen et al. |
| 2017/0146643 A1 | | 5/2017 | Nestler |

OTHER PUBLICATIONS

A New Filter Implementation Strategy for Lagrange Interpolation; by Vesa Valimaki; Helsinki University of Technology Laboratory of Acoustics and Audio Signal Processing; pp. 361-364.

* cited by examiner

*Primary Examiner* — Lincoln D Donovan
*Assistant Examiner* — Dave Mattison
(74) *Attorney, Agent, or Firm* — Hovey Williams LLP

(57) ABSTRACT

A processing element for implementation in a digital signal processing system is provided. The processing element is configured to receive a first data stream comprising a plurality of digital values where each value represents a sample of an analog signal. The processing element is further configured to receive a second data stream comprising a series of digital values where each value represents a sample of the analog signal. The processing element is configured to filter the first data stream via a first Farrow-structured fractional delay (FD) filter and output a filtered first data stream; filter the second data stream via a second Farrow-structured FD filter and output a filtered second data stream; and temporarily store values from the second data stream and output the stored values to the first Farrow-structured FD filter so that the stored values can be used to filter the first data stream.

15 Claims, 6 Drawing Sheets

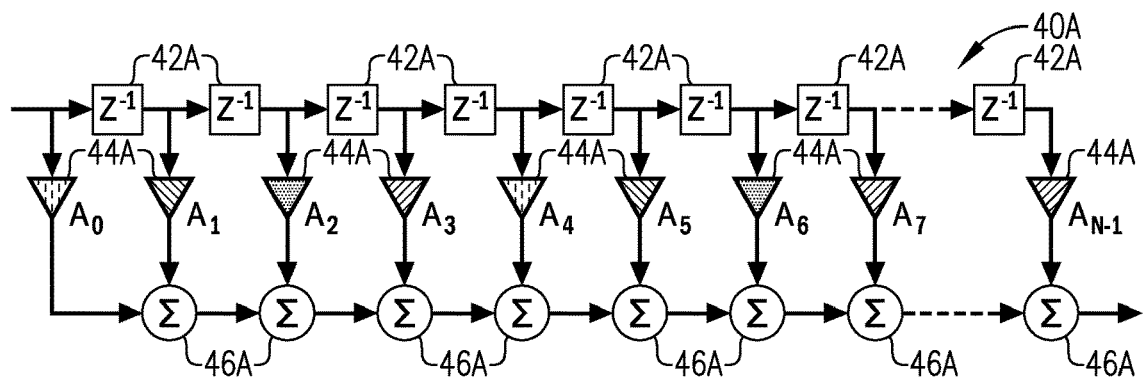
FIG. 4
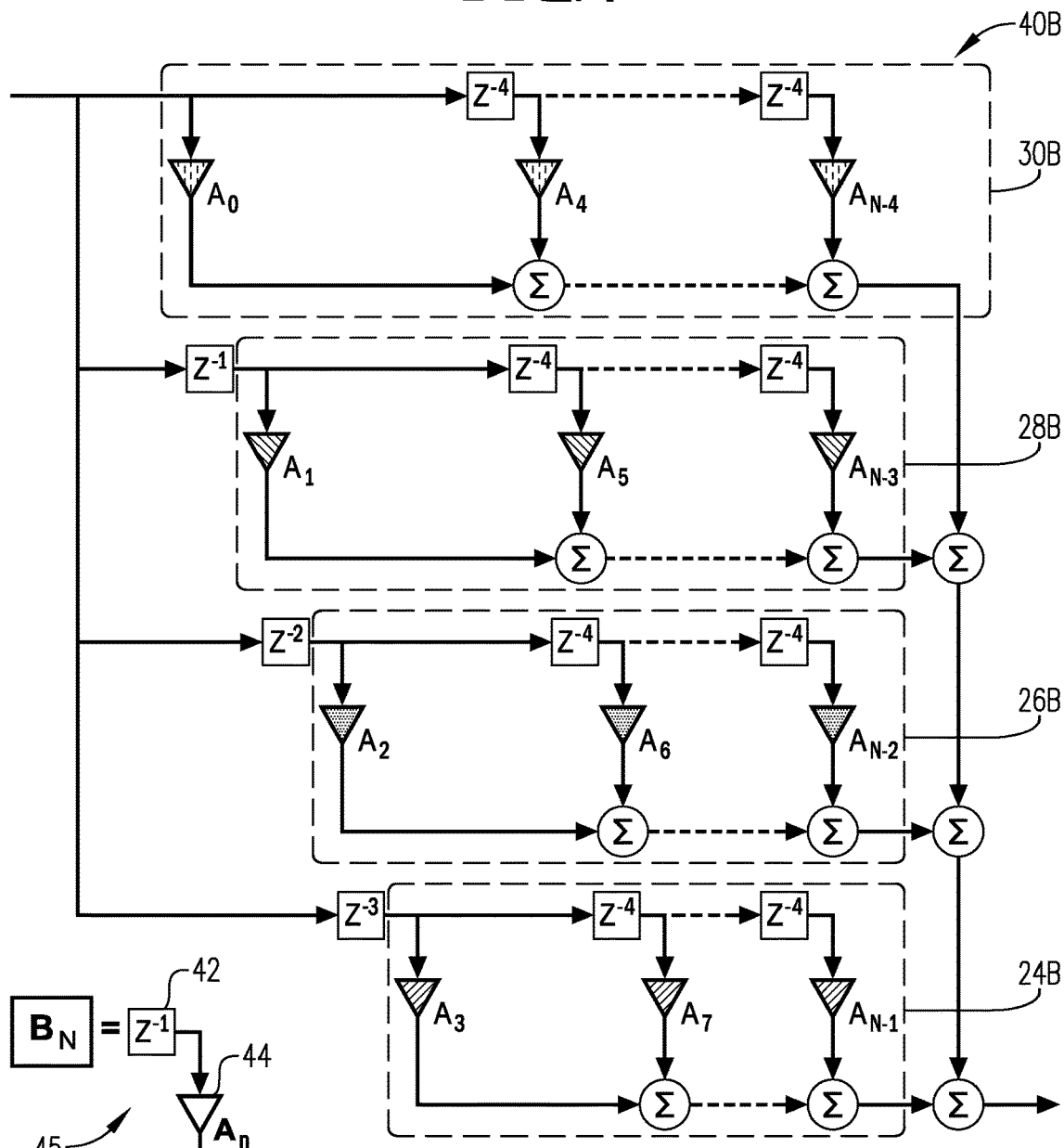
FIG. 5
FIG. 6A

FRACTIONAL DELAY FILTER FOR A DIGITAL SIGNAL PROCESSING SYSTEM

STATEMENT REGARDING FEDERALLY-SPONSORED RESEARCH OR DEVELOPMENT

This invention was made with Government support under Contract No.: DE-NA0002839 awarded by the United States Department of Energy/National Nuclear Security Administration. The Government has certain rights in the invention.

RELATED APPLICATIONS

Certain aspects of the invention described in this non-provisional patent application are related to co-pending non-provisional U.S. application Ser. No. 16/822,197, filed on Mar. 18, 2020, titled "SIMULATION SYSTEM FOR TESTING A RADAR SYSTEM," incorporated by reference herein in its entirety.

BACKGROUND

A digital signal processing system simulates radar environments in which a radar will be used in order to test the radar. During testing, a radar transmitter generates radar signals that the simulator samples for signal processing. The simulator samples the radar signals and then converts the samples into digital values. The simulator manipulates the digital values via digital signal processing so that the radar transmission appears to have interacted with a radar environment. The simulator transmits these manipulated values to the radar receiver. However, the manipulation of the digital values presents distortion issues, which reduce the accuracy of the simulation and therefore the efficacy of the radar test. Additionally, due to large radar bandwidths, the sampling frequency of the simulator is often much higher than the clock rate of the simulator's computing device. Therefore, conventional computing devices employing conventional filtering methods are unable to filter out the distortion in real-time or close-to-real-time.

The background discussion is intended to provide information related to the present invention which is not necessarily prior art.

SUMMARY

The present invention solves the above-described problems and other problems by providing a processing element for implementation in a digital signal processing system. The processing element is configured to receive a plurality of time-ordered digital values from a plurality of parallel data streams; store one or more of the digital values; and weight each of the digital values consistent with a Farrow structured fractional delay filter using the plurality of digital values and one or more previously stored values to produce a plurality of filtered time-ordered digital values. This enables filtering of data using a processing element that has a clock rate that is slower than a sample rate.

A processing element constructed in accordance with another embodiment of the present invention is configured to (a) receive a plurality of parallel, time-ordered data streams, each of the data streams comprising one of a plurality of recent digital values; (b) weight each of the digital values with one or more of their corresponding preceding digital values using a first set of coefficients consistent with a finite impulse response (FIR) filter to produce a first set of sums; (c) multiply the first set of sums by a value representative of a fractional delay to produce a first set of products; (d) weight the digital values with their corresponding preceding digital values using a second set of coefficients consistent with the FIR filter to produce a second set of sums; (e) add the second set of sums with the first set of products to produce a third set of sums; (f) multiply the third set of sums by the value representative of the fractional delay to produce a second set of products; (g) repeat steps (d) through (f) one or more times using a remaining sets of coefficients consistent with the FIR filter to produce a final set of products; and (h) add the final set of products with their corresponding digital values to produce a plurality of output values.

Another embodiment of the invention is a digital processing system. The system comprises an analog-to-digital converter, a processing element, and a digital-to-analog converter. The analog-to-digital converter is configured to receive a first analog signal and convert the first analog signal to a first digital serial data stream comprising a sequence of digital values representing samples of the analog signal. The processing element is configured to (a) convert the digital serial data stream into M parallel, time-ordered data streams, each of the data streams comprising one of M digital values representing a most recent M samples; (b) weight the M digital values with their preceding N−1 digital values using a first set of coefficients consistent with a finite impulse response (FIR) filter with an order of N to produce a first set of M sums; (c) multiply the first set of M sums by a value representative of a fractional delay to produce a first set of M fractionally-delayed products; (d) weight the M digital values with their preceding N−1 digital values using a second set of coefficients consistent with the FIR filter to produce a second set of M sums; (e) add the second set of M sums with the first set of M fractionally-delayed products to produce a third set of M sums; (f) multiply the third set of M sums by the value representative of the fractional delay to produce a second set of M fractionally-delayed products; (g) repeat steps (d) through (f) N−2 times with remaining sets of coefficients consistent with the FIR filter to produce an Nth−1 set of M fractionally-delayed products; (h) add the Nth−1 set of M fractionally-delayed products with their corresponding M digital values to produce output values; and (i) output a second digital output stream comprising the output values. The digital-to-analog converter is configured to convert the second digital output stream into a second analog signal.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the embodiments and the accompanying drawing figures.

BRIEF DESCRIPTION OF THE DRAWING FIGURES

Embodiments of the present invention are described in detail below with reference to the attached drawing figures, wherein:

FIG. 4 is a schematic diagram of a single finite impulse response (FIR) filter of the FD filter of FIG. 3;

FIG. 5 is a schematic diagram of an expanded version of the FIR filter of FIG. 4;

FIG. 6A is a schematic diagram of a block of a FIR filter according to one embodiment of the present invention;

Figure 1:
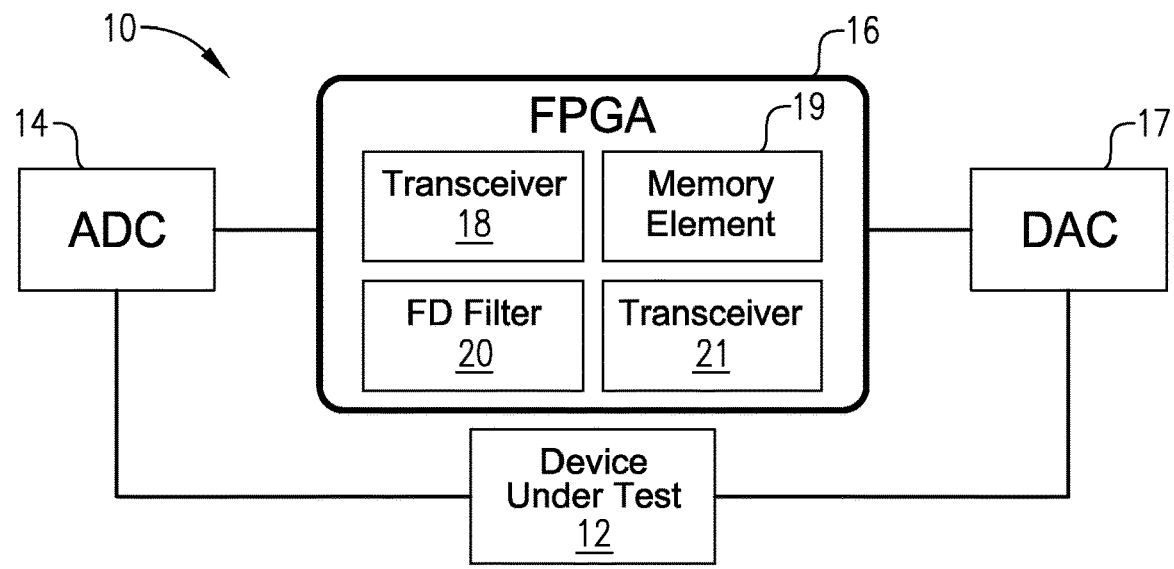
FIG. 1 is a schematic diagram of an exemplary digital signal processing system which may implement aspects of the present invention.

The drawing figures do not limit the present invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Turning to FIG. 1, an exemplary digital signal processing (DSP) system 10 which may implement aspects of the present invention is depicted. The DSP system 10 is configured to test a radar device 12. The radar device 12 may be any device configured to generate radio signals to measure and/or detect an aspect of its surroundings. While under test, the radar device 12 generates a radar signal. The DSP system 10 is configured to receive and modify the radar signal to simulate an environment to test the radar device 12 and then transmit the modified radar signal back to the radar device 12.

The DSP system 10 may comprise an analog-to-digital converter (ADC) 14, a field-programmable gate array (FPGA) 16, and a digital-to-analog converter (DAC) 17. The ADC 14 is provided for sampling the radar signal of the radar device 12 and converting the samples into digital numbers, or digital outputs, representative of the samples for further processing by the FPGA 16. The ADC 14 samples the radar signals at a high frequency for higher resolution and accuracy. For example, in one embodiment, the ADC 14 may sample the radar signal at a rate of 1 billion samples per second, or 1 Giga samples per second (GS/s), with each sample including 16-bit digital numbers. Thus, the ADC 14 outputs a high-speed serial data stream.

The FPGA 16 is provided for various computing functions, including processing the radar signal from the radar device 12. The FPGA 16 is configured to receive the high-speed serial data stream and process the data representative of the radar signal for various DSP system 10 functions. The FPGA 16 includes a first transceiver circuit 18, a memory element 19, a Farrow-structured fractional delay (FD) filter 20, and a second transceiver circuit 21. The FPGA 16 may have a clock rate that is a fraction of the sample rate of the ADC 14. For example, in one embodiment, the FPGA 16 may have a clock rate of only 250 MHz, which is a fourth of the sample rate of the ADC 14 at 1 GS/s. Applicants have encountered problems implementing some DSP functions such as a finite impulse response (FIR) filter due to the difference between the sample rate of the ADC 14 and the clock rate of the FPGA 16. In some embodiments, the functions and circuits of the FPGA 16 may be implemented on a different type of processing element, such as a microcontroller, microprocessor, application specific integrated circuits, central processing units, or the like.

Figure 2:
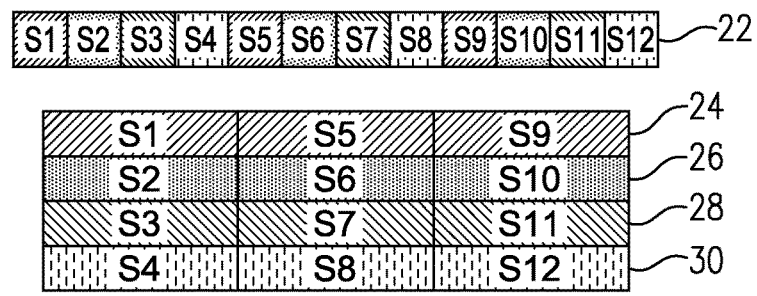
FIG. 2 is a schematic diagram of data streams used in conjunction with embodiments of the present invention.

The first transceiver circuit 18 is provided for converting the serial data stream from the ADC 14 into time-ordered, parallel data streams. For example, as shown in FIG. 2, the first transceiver circuit 18 may be configured to convert serial data stream 22 into multiple time-ordered, parallel data streams 24, 26, 28, 30. The samples of the radar signal from the radar device 12 may be represented by S1, S2, S3, S4, S5, S6, S7, S8, S9, S10, S11, and S12. The order of the samples is the order in which they were sampled in time, or a time-order. S1 is the first sample of the set, and S12 is the last. Thus, the parallel data streams 24, 26, 28, 30 maintain this time-order wherein data stream 24 conveys S1, data stream 26 conveys S2, data stream 28 conveys S3, and data stream 30 conveys S4. This continues for the next set of samples where data stream 24 conveys S5, data stream 26 conveys S6, data stream 28 conveys S7, data stream 30 conveys S8, etc. FIG. 2 depicts the serial data stream 22 being converted into four parallel data streams 24, 26, 28, 30; however, the serial data stream 22 may be converted into any number of parallel data streams without departing from the scope of the present invention.

In one embodiment, the first transceiver circuit 18 may convert the serial data stream into parallel streams by first converting the serial data stream 22 passing 16-bit digital samples into two very high-speed serial data streams operating at 8 billion bits per second, or 8 giga bits per second (Gbps). The first transceiver circuit 18 may be configured to convert the two very high-speed serial data streams into two streams of 32-bit data words operating at 250 MHz. Finally, the first transceiver circuit 18 may concatenate the 32-bit data word streams into a single 64-bit data word stream, wherein each 64-bit data word contains four consecutive samples, such as S1, S2, S3, and S4, each being 16-bit samples. The first transceiver circuit 18 may output the 64-bit data words at the clock rate of the FPGA 16. The FPGA 16 may be configured to treat the 64-bit data word stream as parallel data streams 24, 26, 28, 30. The first transceiver circuit 18 may include any number of stages and/or transceivers without departing from the scope of the present invention. Further, the first transceiver circuit 18 may be integral with the FPGA 16, external to the FPGA 16, or a combination of both.

The memory element 19 is configured to store digital values from the transceiver circuit 18 which can be read by the FD filter 20 after a configurable time delay to simulate distance to target or modified to simulate a moving target. The memory element 19 may be used to provide static delays which simulate a target that is not moving relative to the radar device 12. Additionally or alternatively, the memory element 19 may be used to provide dynamic delays, which simulate a target moving relative to the radar device 12. The memory element 19 may be integral with the FPGA 16, external to the FPGA 16, or a combination of both. For example, the memory element 19 may comprise one or more memory components, including internal or external memory components, such as read-only memory (ROM), programmable ROM, erasable programmable ROM, random-access memory (RAM) such as static RAM (SRAM) or dynamic RAM (DRAM), cache memory, hard disks, floppy disks, optical disks, flash memory, thumb drives, universal serial bus (USB) drives, or the like, or combinations thereof.

The FD filter 20 is provided for filtering the parallel data streams 24, 26, 28, 30, including performing Lagrange interpolation to refine delay resolution in the simulation and to increase the fidelity of the data of the radar signal from the radar device 12. The FD filter 20 may include and/or be represented by one or more $Z^{-1}$ delay elements, one or more FD gain elements, one or more FD adder elements, and one or more finite impulse response (FIR) filters.

The $Z^{-1}$ delay elements are provided for delaying one or more of the parallel data streams 24, 26, 28, 30 so that all of the most recent and preceding samples required to produce all corresponding data stream outputs are available. The $Z^{-1}$ delay elements are preferably implemented as memory components internal to the FPGA 16. However, the $Z^{-1}$ delay elements may comprise one or more other memory elements without departing from the scope of the present invention, including internal or external memory components, such as read-only memory (ROM), programmable ROM, erasable programmable ROM, random-access memory (RAM) such as static RAM (SRAM) or dynamic RAM (DRAM), cache memory, hard disks, floppy disks, optical disks, flash memory, thumb drives, universal serial bus (USB) drives, or the like, or combinations thereof. The $Z^{-1}$ delay elements may be configured to delay one of the data streams 24, 26, 28, 30 for a clock cycle of the FPGA 16. In other words, the $Z^{-1}$ delay elements may be configured to receive one of the digital samples from one of the data streams 24, 26, 28, 30, hold it for a clock cycle of the FPGA 16, and then output the digital sample during the next clock cycle of the FPGA 16. The number of $Z^{-1}$ delay elements may be one less than the number of parallel data streams 24, 26, 28, 30.

Figure 3:
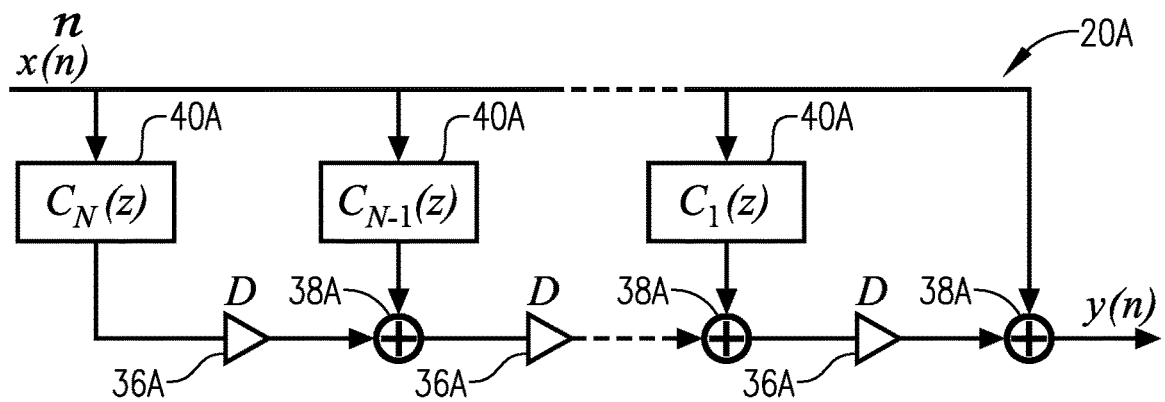
FIG. 3 is a schematic diagram of a topology of a Farrow-structured fractional delay (FD) filter.

FIG. 3 depicts a general topology of an Nth-order FD filter 20A. FD filter 20A includes a number (N) of FD gain elements 36A, N FD adder elements 38A, and N FIR filters 40A.

The FD gain elements 36A provide a value that, at least in part, represents a fractional delay. The fractional delay may be a delay that is a fraction of the clock cycle and/or the sample cycle corresponding to the sample rate. The FD gain elements 36A multiply the outputs of the FIR filters 40A by the value before the outputs are passed to the FD adder circuits 38A. The fractional delay may be predetermined and or modifiable. The FD gain elements 36A may be configured to receive an output of one of the FIR filters 40A, multiply the output by a value representative of the fractional delay, and then send the output to one of the FD adder circuits 38A.

The FD adder circuits 38A are configured to add an output of one of the FIR filters 40A with outputs of other FIR filters 40A. For example, one of the FD adder circuits 38A may receive an output from one of the FIR filters 40A and add it with an output from one of the FD gain elements 36A, which is product of the FD gain and the output of one of the other FIR filters 40A. The output of the FD adder circuits 38A may be sent to one of the FD gain elements 36A.

The FIR filters 40A are provided for processing the digital samples and weighting them so that outputs of the FIR filters 40A are weighted sums of the most recent digital samples. The number of digital samples to be included in the weighting is determined by the order of the FIR filters 40A. FIG. 4 depicts the general topology of an N-th order FIR filter 40A having a plurality of FIR delay elements 42A, a plurality of multiplication elements 44A, and a plurality of FIR adder elements 46A.

The FIR delay elements 42A are similar to the $Z^{-1}$ delay elements in that they temporarily store digital samples so that the outputs of the FIR filters 40A are based on multiple time-ordered digital samples. The FIR delay elements 42A may be configured to receive one of the digital samples, hold it for a clock cycle of the FPGA 16, and output the digital sample for the next clock cycle. The FIR delay elements 42A are positioned between the multiplication elements 44A.

The multiplication elements 44A multiply the digital samples by coefficients, $A_0, A_1, A_2, A_3, A_4, A_5, A_6, A_7 \ldots A_{N-1}$. The coefficients $A_0, A_1, A_2, A_3, A_4, A_5, A_6, A_7 \ldots A_{N-1}$ are based on the order (N) of the FIR filters 40A. The multiplication circuits 44A are configured to receive a digital sample and multiply the digital sample by their corresponding coefficient $A_0, A_1, A_2, A_3, A_4, A_5, A_6, A_7 \ldots A_{N-1}$. The outputs of the multiplication elements 44A are the product of the digital sample and the corresponding coefficient $A_0, A_1, A_2, A_3, A_4, A_5, A_6, A_7 \ldots A_{N-1}$. The outputs of the multiplication elements 44A are sent to the FIR adder elements 46A.

The FIR adder elements 46A are provided for adding the outputs of the multiplication elements 44A. The FIR adder elements 46A enable a current digital sample to be weighted with any preceding digital samples to produce the output of the FIR filter 40A. The FIR adder elements 46A may be similar to the FD adder elements 38A. For example, the FIR adder elements 46A may utilize the same components as the FD adder elements 38A and/or utilize completely different components. Additionally, the FIR adder elements 46A may separately comprise the same or similar components as the FD adder elements 38A.

Applicants have discovered that the general topologies of the FD filter 20A having the FIR filters 40A depicted in FIGS. 3 and 4 would not function with parallel data streams 24, 26, 28, 30 because one of the FIR filters 40A would receive, for example, S1, S5, and S9, which would result in an inappropriately weighted output of the FIR filter 40A. Applicants have found that the FIR filter 40A can be reconfigured as shown in the topology of FIR filter 40B shown in FIG. 5. FIR filter 40B also includes one or more FIR delay elements 42B, one or more multiplication elements 44B, and one or more FIR adder elements 46B.

FIG. 5 shows an intermediate representation of the FIR filter 40A of FIG. 3 split into four parallel sub-components 24B, 26B, 28B, 30B. The multiplication elements 44A of FIR filter 40A are split among the four parallel sub-components 24B, 26B, 28B, 30B so that the order of each of the four parallel sub-components 24B, 26B, 28B, 30B is N/4. The reference numerals of the sub-components 24B, 26B, 28B, 30B correspond to the parallel data streams 24, 26, 28, 30. However, the output of FIR filter 40B is a serial data stream passing outputs at a rate equal to the sample rate, which is higher than the clock rate of the FPGA 16. The present invention modifies FIR filter 40B to receive parallel data streams 24, 26, 28, 30 at the clock rate of the FPGA 16 and output four parallel data streams at the clock rate of the FPGA 16, wherein the data samples in the output data streams have been filtered in an identical manner as the FIR filter 40A of FIG. 4.

Figure 6B:
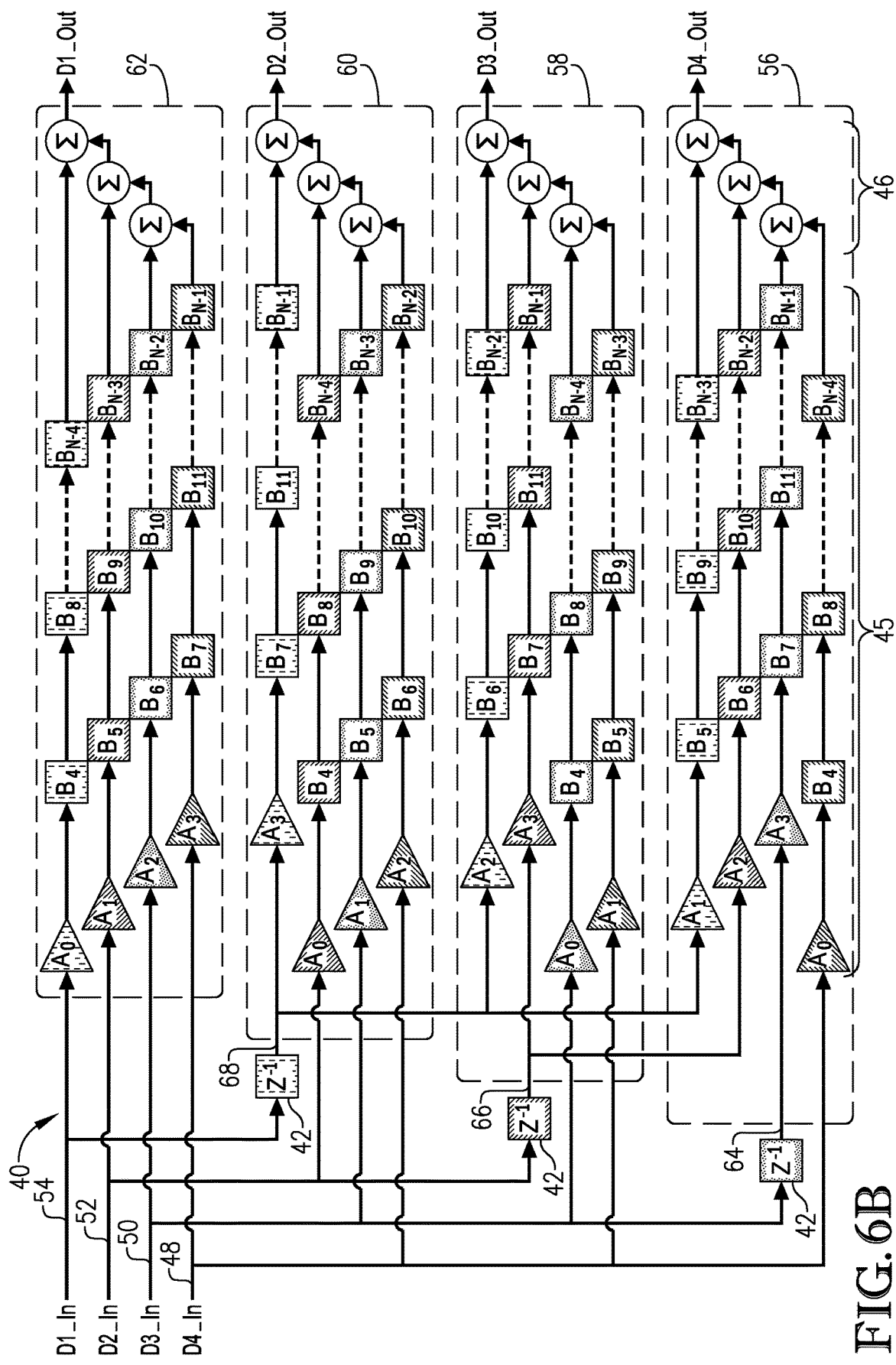
FIG. 6B is a schematic diagram of a FIR filter according to one embodiment of the present invention.

FIGS. 6A and 6B depict an N-th order FIR filter 40 constructed in accordance with an embodiment of the present invention. FIG. 6A shows that each block 45 (BN) in FIG. 6B represents a FIR delay element 42, a multiplication element 44, and a FIR adder element 46, for n>3. The FIR filter 40 of FIG. 6B is similar to the FIR filter 40A of FIG. 4 in that it is also provided for processing the digital samples and weighting them so that the output of the FIR filter 40 is weighted sums of the most recent digital samples, except that FIR filter 40 has a plurality of inputs 48, 50, 52, 54 and a plurality of sub-components 56, 58, 60, 62. Given the same input data samples, the output samples of FIR filter 40 of FIG. 6B would be identical to the output samples of FIR filter 40A of FIG. 4, except that the input and output data samples to and from the FIR filter 40A of FIG. 4 are provided in a single data stream of samples at the ADC 14/DAC 17 sample rate while the input and output data samples to and from the FIR filter 40 of FIG. 6B are provided in four parallel data streams at the FPGA clock rate which is ¼ of the ADC 14/DAC 17 sample rate.

As depicted in FIG. 4, each output sample from a FIR filter 40A is a weighted sum of all N previous samples with the weighting provided by the coefficients A0 through $A_{N-1}$ for a Nth order FIR filter 40A. FIG. 6B shows how, in accordance with the present invention, the N coefficients are applied to each of the four input data streams and how each of the four output data streams receives data samples weighted by data received from all four input data streams. This is accomplished by applying the subdivided FIR filter 40B of FIG. 5 to all four input data streams. The three FIR delay elements 42 depicted in FIG. 6B are of the FPGA clock rate which is ¼ of the ADC 14/DAC 17 sample rate. Applying this delay is equivalent to four $Z^{-1}$ delays at the ADC 14/DAC 17 sample rate as depicted in FIG. 5. Applying this delay is necessary where shown on data streams D1_In 54, D2_In 52 and D3_In 50 in order to get all four of the most recent and three preceding samples required to produce all four data stream outputs. For data stream D4_In 48 this is not necessary because the most recent and three preceding samples are all contained within the most recent block of four samples across data streams D1_In 54, D2_In 52, D3_In 50 and D4_In 48.

Similar to FIR filter 40A, FIR filter 40 includes a plurality of FIR delay elements 42, a plurality of multiplication elements 44, and a plurality of FIR adder circuits 46. Similar to FIR delay elements 42A, FIR delay elements 42 are configured to produce delayed data streams 64, 66, 68. FIR delay elements 42 are configured to receive a digital sample from one of the data streams 26, 28, 30, hold the digital sample for a clock cycle of the FPGA 16, and then output the digital sample, thereby producing delayed data streams 64, 66, 68. The number of FIR delay elements 42 is one less than the number of inputs 48, 50, 52, 54, or data streams 24, 26, 28, 30. However, any number of FIR delay elements 42 may be used without departing from the scope of the present invention.

The multiplication elements 44 are similar to multiplication elements 44A and are provided for multiplying the digital samples by coefficients, $A_0$, $A_1$, $A_2$, $A_3$, $A_4$, $A_5$, $A_6$, $A_7 \ldots A_{N-1}$. The multiplication elements 44 are configured so that the sub-components 56, 58, 60, 62 multiply their corresponding data streams 24, 26, 28, 30 by coefficients $A_0$, $A_4 \ldots A_{N-4}$. Further, any preceding digital samples in the data streams 24, 26, 28, 30 are multiplied by coefficients $A_1$, $A_5 \ldots A_{N-3}$, $A_2$, $A_6 \ldots A_{N-2}$, or $A_3$, $A_7 \ldots A_{N-1}$, depending on by how many sample cycles the digital samples preceded the sample in the corresponding data stream 24, 26, 28, 30. For example, in sub-component 62, S4 of data stream 30 would be multiplied by $A_0$, $A_4 \ldots A_{N-4}$; S3 which precedes S4 and is of data stream 28 would be multiplied by $A_1$, $A_5 \ldots A_{N-3}$, S2 which precedes S4 and is of data stream 26 would be multiplied by $A_2$, $A_6 \ldots A_{N-2}$, and S1 which precedes S4 and is of data stream 24 would be multiplied by $A_3$, $A_7 \ldots A_{N-1}$.

The plurality of FIR adder elements 46 are similar to FIR adder elements 46A and are provided for summing the outputs of the multiplication elements 44 thereby resulting in the outputs of the sub-components 56, 58, 60, 62.

The plurality of inputs 48, 50, 52, 54 are provided for receiving the parallel data streams 24, 26, 28, 30. Input 48 receives data stream 24, input 50 receives data stream 26, input 52 receives data stream 28, and input 54 receives data stream 30. While FIG. 6B depicts the FIR filter 40 having four inputs 48, 50, 52, 54, the FIR filter 40 may have any number without departing from the scope of the present invention. The inputs 48, 50, 52, 54 are connected to and pass the data streams 24, 26, 28, 30 to corresponding sub-components 56, 58, 60, 62. Specifically, sub-component 56 is connected to input 48 and corresponds to data stream 24, sub-component 58 is connected to input 50 and corresponds to data stream 26, sub-component 60 is connected to input 52 and corresponds to data stream 28, and sub-component 62 is connected to input 54 and corresponds to data stream 30.

The sub-components 56, 58, 60, 62 are provided for parallel filtration of the data streams 24, 26, 28, 30 so that the volume of data flowing into the inputs 48, 50, 52, 54 each clock cycle is equal to the volume of data output by the sub-components 56, 58, 60, 62 every clock cycle. Each sub-component 56, 58, 60, 62 is configured to receive its corresponding data stream 24, 26, 28, 30 from one of the inputs 48, 50, 52, 54. Further, each sub-component 56, 58, 60, 62 is configured to receive any data stream 24, 26, 28, 30 that precedes its corresponding data stream 24, 26, 28, 30. The sub-components 56, 58, 60, 62 are also configured to receive delayed data streams 64, 66, 68 that are subsequent to that sub-component's corresponding data stream 26, 28, 30.

For example, sub-component 58 is configured to receive data stream 26 from input 50. Because data stream 24 contains digital samples that precede the digital samples in data stream 26 in time, sub-component 58 is configured to receive data stream 24 by being connected to input 48. Further, because data streams 28, 30 are subsequent to data stream 26, or contain digital samples that are subsequent in time to the digital samples in data stream 26, sub-component 58 is configured to receive their corresponding delayed data streams 66, 68.

Figure 7:
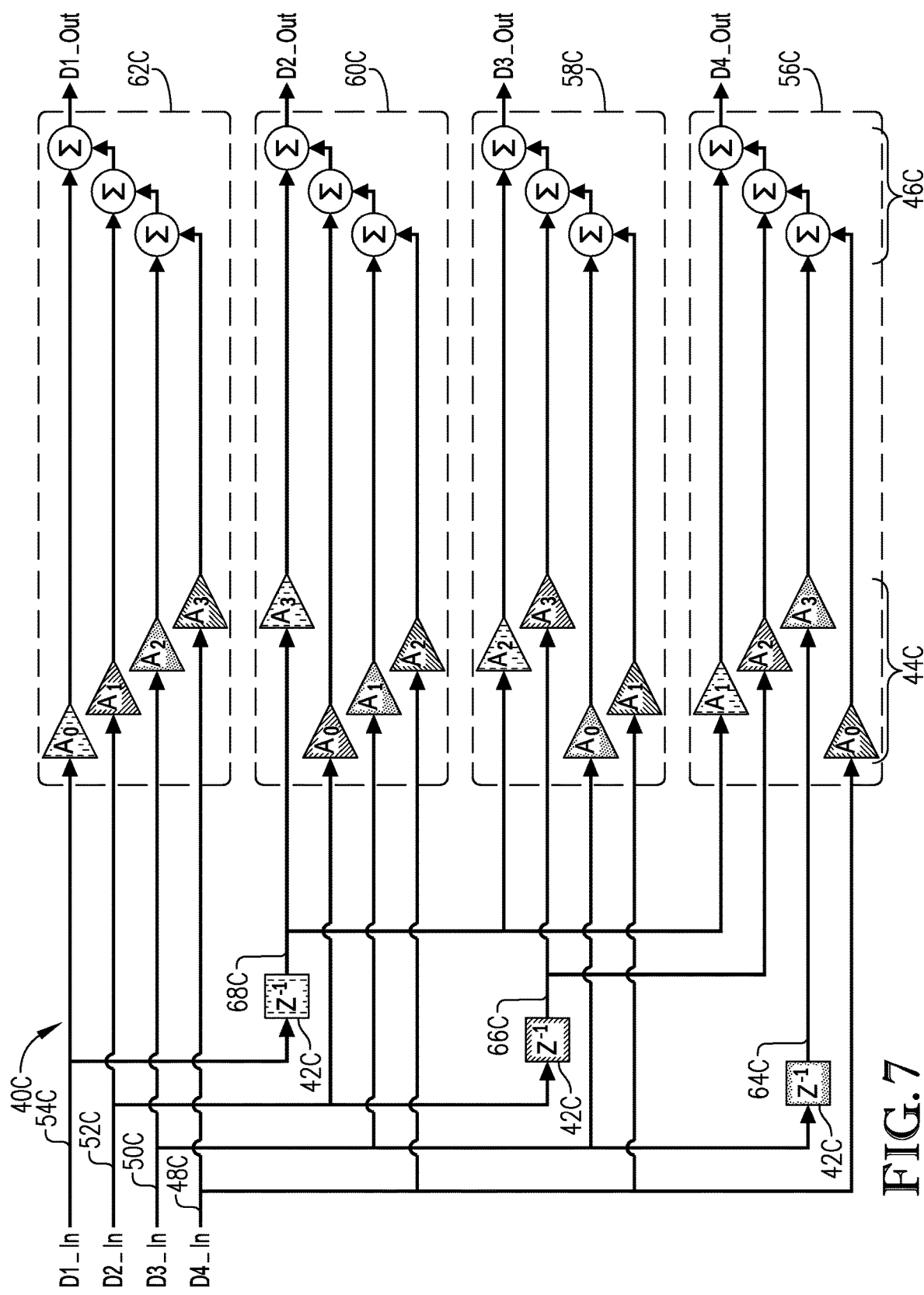
FIG. 7 is a schematic diagram of a FIR filter according to another embodiment of the present invention.

The FIR filter 40 may have any number of inputs and FIR sub-components without departing from the scope of the present invention. Additionally, the FIR filter 40 may be of any order. For example, FIG. 7 depicts a 4th order FIR filter 40C constructed in accordance with another embodiment of the present invention. The FIR filter 40C may comprise substantially similar components as FIR filter 40; thus, the components of FIR filter 40C that correspond to similar components in FIR filter 40 have a 'C' appended to their reference numerals.

Similar to FIR filter 40, $4^{th}$ order FIR filter 40C includes FIR delay elements 42C, multiplication elements 44C, FIR adder elements 46C, inputs 48C, 50C, 52C, 54C, FIR sub-components 56C, 58C, 60C, 62C, and delayed data streams 64C, 66C, 68C. The difference between FIR filter 40C and FIR filter 40 is that FIR filter 40C is 4th order. Otherwise it is substantially the same as FIR filter 40. Because FIR filter 40C is 4th order, there are only four coefficients $A_0$, $A_1$, $A_2$, $A_3$ associated with multiplication elements 44C.

Figure 8:
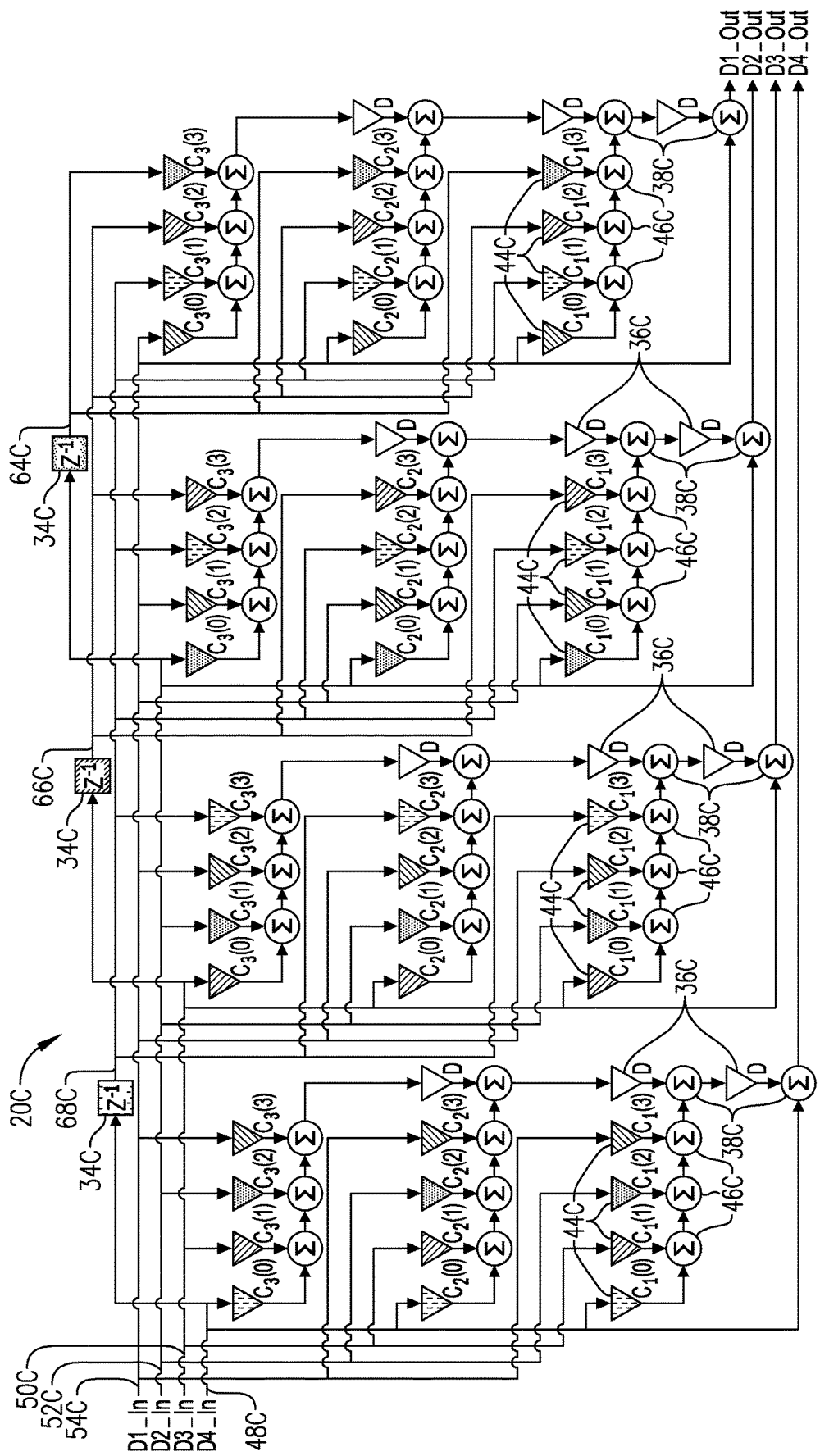
FIG. 8 is a schematic diagram of a Farrow-structured FD filter constructed in accordance with an embodiment of the present invention.

FIG. 8 depicts the topology of a 4th order, Farrow-structured FD filter 20C constructed in accordance with an embodiment of the present invention. The FD filter 20C comprises a plurality of 4th order FIR filters 40C of FIG. 7. The FD filter 20C may comprise substantially similar components as FD filter 20; thus, the components of FD filter 20C that correspond to similar components in FD filter 20 have a 'C' appended to their reference numerals.

The FD filter 20C includes a plurality of $Z^{-1}$ delay elements 34C a plurality of FD gain elements 36C, a plurality of FD adder elements 38C, a plurality of multiplication elements 44C, and a plurality of FIR adder circuits 46C. The $Z^{-1}$ delay elements 34C are substantially the same as the $Z^{-1}$ delay elements.

The FD gain elements 36C are provided for representing a fractional delay before outputs of the FIR filters 40C are passed to the FD adder elements 38C. The fractional delay may be predetermined and or modifiable. The FD gain elements 36C may be configured to receive an output of the FIR filters 40C, multiply the output by the value representing the fractional delay, and then send the output to the FD adder elements 38C.

The FD adder elements 38C are configured to add an output of one of the FIR filters 40C with outputs of other FIR filters 40C. For example, one of the FD adder elements 38C may receive an output from one of the FIR filters 40C and add it with an output from one of the FD gain elements 36C, which is an output of one of the other FIR filters 40C. The output of the FD adder elements 38C may be sent to one of the FD gain elements 36C.

The multiplication elements 44C and FIR adder circuits 46 are provided for processing the digital samples and weighting them to provide weighted sums of the most recent digital samples. The multiplication elements 44C and FIR adder circuits 46 essentially form sixteen (16) FIR filters. Instead of the FIR filters formed by the multiplication elements 44C and FIR adder circuits 46 having their own FIR delay elements 42C, the FD filter 20C includes $Z^{-1}$ delay elements 34C which are configured to produce delayed data streams 64C, 66C, 68C. $Z^{-1}$ delay elements 34C are configured to receive a digital sample in one of the data streams 26, 28, 30, hold the digital sample for a clock cycle of the FPGA 16, and then output the digital sample, thereby producing delayed data streams 64C, 66C, 68C. As depicted in FIG. 8, the number of $Z^{-1}$ delay elements 34C is one less than the number of inputs 48C, 50C, 52C, 54C or the number of data streams 24, 26, 28, 30. However, any number of $Z^{-1}$ delay elements 34C may be used without departing from the scope of the present invention.

The multiplication elements 44C are similar to multiplication elements 44 and are provided for multiplying the digital samples by predetermined coefficients, except that the predetermined coefficients are $C_0(z)$, $C_1(z)$, $C_2(z)$, $C_3(z)$, which are defined by equations 1-4 below. The coefficients for $C_n(z)$ can be found using equation 5 with $q_n$ being the values of an inverse Vandermonde matrix. As shown in equation 1, $C_0$ is equal to 1 no matter the value of z; thus, the FIR filter 40C having the $C_0$ coefficient is not depicted in the topology of FIG. 8. The multiplication elements 44C are configured so that the sub-components 56C, 58C, 60C, 62C multiply their corresponding data streams 24, 26, 28, 30 by coefficients $C_0(0)$, $C_1(0)$, $C_2(0)$, $C_3(0)$. Further, any preceding digital samples in the data streams 24, 26, 28, 30 are multiplied by coefficients $C_0(1)$, $C_1(1)$, $C_2(1)$, $C_3(1)$; $C_0(2)$, $C_1(2)$, $C_2(2)$, $C_3(2)$; $C_0(3)$, $C_1(3)$, $C_2(3)$, $C_3(3)$, depending on how many sample cycles the digital samples preceded the sample in the corresponding data stream 24, 26, 28, 30. For example, in sub-component 62C, S4 of data stream 30 would be multiplied by $C_0(0)$, $C_1(0)$, $C_2(0)$, $C_3(0)$. S3 precedes S4 and is of data stream 28, so it would be multiplied by $C_0(1)$, $C_1(1)$, $C_2(1)$, $C_3(1)$. S2 precedes S4 and is of data stream 26, so it would be multiplied by $C_0(2)$, $C_1(2)$, $C_2(2)$, $C_3(2)$. S1 which precedes S4 and is of data stream 24, so it would be multiplied by $C_0(3)$, $C_1(3)$, $C_2(3)$, $C_3(3)$.

$$C_0(z) = 1 \tag{1}$$

$$C_1(z) = -1.833 + 3z^{-1} - 1.5z^{-2} + 0.3333z^{-3} \tag{2}$$

$$C_2(z) = 1 - 2.5z^{-1} + 2z^{-2} - 0.5z^{-3} \tag{3}$$

$$C_3(z) = -0.1667 + 0.5z^{-1} - 0.5z^{-2} + 0.1667z^{-3} \tag{4}$$

$$C_n(z) = \sum_{k=0}^{N} q_n(k)z^{-k} \text{ for } n = 1, 2, \ldots, N \tag{5}$$

Similar to the plurality of FIR adder elements 46, FIR adder elements 46C are provided for summing the outputs of the multiplication elements 44C thereby resulting in the outputs of the sub-components 56C, 58C, 60C, 62C.

Instead of each FIR filter having its own plurality of inputs 48, 50, 52, 54, FD filter 20C includes a plurality of inputs 48C, 50C, 52C, 54C shared among the FIR filters. The inputs 48C, 50C, 52C, 54C are provided for receiving the parallel data streams 24, 26, 28, 30. Input 48C receives data stream 24, input 50C receives data stream 26, input 52C receives data stream 28, and input 54C receives data stream 30. While FIG. 8 depicts four inputs 48C, 50C, 52C, 54C, any number of inputs may be implemented without departing from the scope of the present invention, i.e., the present invention could be applied to any number of input data streams and any order of Farrow-structured FD filter.

Figure 9:
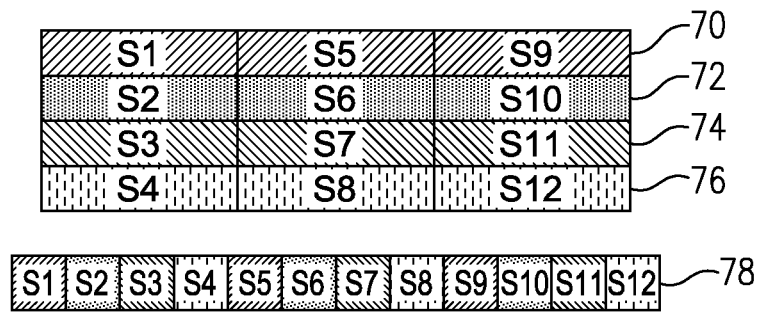
FIG. 9 is a schematic diagram of filtered data streams used in conjunction with embodiments of the present invention.

Turning back to FIG. 1, the second transceiver circuit 21 converts the parallel data streams from the FD filter 20 into a serial data stream. For example, as shown in FIG. 9, the second transceiver circuit 21 may be configured to convert the multiple time-ordered, parallel data streams 70, 72, 74, 76 received from the outputs (D1_Out, D2_Out, D3_Out, D4_Out) of the FD filter 20C into the serial data stream 78. The filtered samples from the FD filter 20C may be represented by S1, S2, S3, S4, S5, S6, S7, S8, S9, S10, S11, and S12. The order of the samples is the order in which they were sampled in time, or a time-order. S1 is the first sample of the set, and S12 is the last. The serial data stream 78 is then passed to the DAC 17. The second transceiver circuit 21 may be integral with the FPGA 16, external to the FPGA 16, or a combination of both. The DAC 17 is connected to the FPGA 16 and is configured to convert the digital serial data stream 78 to analog samples for processing by the radar device 12.

In use, the radar device 12 emits a radar signal that the ADC 14 samples at a sample rate. The ADC 14 converts the analog samples to digital samples at the sample rate and outputs the digital samples creating a serial data stream 22. The transceiver 18 of the FPGA 16 receives the serial data stream 22 and converts the serial data stream 22 into a plurality of parallel data streams 24, 26, 28, 30. The memory element 19 of the FPGA 16 receives the parallel data streams 24, 26, 28, 30. The data is written to the memory element 19 and read from memory element 19 after a delay configured to simulate the distance to a target, including a moving or stationary target.

The FD filter 20 receives the parallel data streams 24, 26, 28, 30 from the memory element 19 and filters them via its plurality of FIR filters, FD adder elements, and FD gain elements. The FIR filters receive their corresponding parallel data streams 24, 26, 28, 30 and any preceding data streams 24, 26, 28, 30 via inputs 48, 50, 52, 54. The FIR filters also receive delayed data streams 64, 66, 68 via the $Z^{-1}$ delay elements for any data streams 24, 26, 28, 30 subsequent to their corresponding data streams 24, 26, 28, 30. The FIR filters are configured to weight the digital samples in the data streams 24, 26, 28, 30 so that the outputs of the FIR filters are weighted sums of recent digital samples. The FIR filters weight the digital samples via their multiplication elements and FIR adder elements.

The FD adder elements add the outputs of the FIR filters with outputs of immediately preceding FIR filters multiplied by the FD gain elements. The outputs of the FD adder elements are then multiplied by the value representing the fractional delay via the FD gain elements before finally being added with a current digital sample from the corresponding data streams 24, 26, 28, 30 via the FD adder elements. The outputs of the FD adder elements are the outputs of the FD filter 20.

Figure 10:
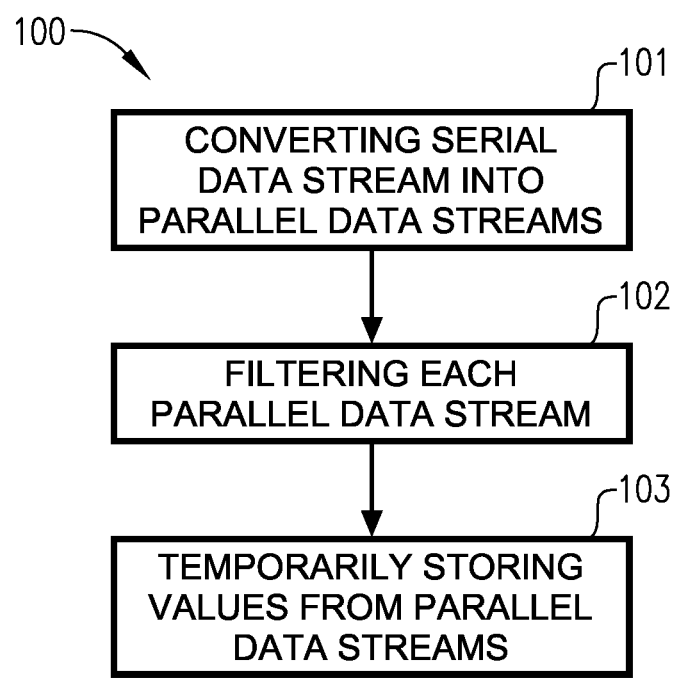
FIG. 10 is a flowchart illustrating at least a portion of the steps for filtering time-ordered parallel data streams.

The flow chart of FIG. 10 depicts the steps of an exemplary method 100 of filtering time-ordered, parallel data streams 24, 26, 28, 30 converted from the serial data stream 22 representative of samples of the radar signal from the radar device 12. In some alternative implementations, the functions noted in the various blocks may occur out of the order depicted in FIG. 10. For example, two blocks shown in succession in FIG. 10 may in fact be executed substantially concurrently, or the blocks may sometimes be executed in the reverse order depending upon the functionality involved. In addition, some steps may be optional.

The method 100 is described below, for ease of reference, as being executed by exemplary devices and components introduced with the embodiments illustrated in FIGS. 1-2 and 6-9. For example, the steps of the method 100 may be performed by the DSP system 10, the ADC 14, the FPGA 16, and the DAC 17 through the utilization of processors, transceivers, hardware, software, firmware, or combinations thereof. However, a person having ordinary skill will appreciate that responsibility for all or some of such actions may be distributed differently among such devices or other computing devices without departing from the spirit of the present invention. One or more computer-readable medium(s) may also be provided. The computer-readable medium(s) may include one or more executable programs stored thereon, wherein the program(s) instruct one or more processing elements to perform all or certain of the steps outlined herein. The program(s) stored on the computer-readable medium(s) may instruct the processing element(s) to perform additional, fewer, or alternative actions, including those discussed elsewhere herein.

Referring to step 101, the serial data stream 22 is converted into a plurality of time-ordered, parallel data streams 24, 26, 28, 30. The serial data stream 22 may comprise a plurality of digital values that represent samples of a radar signal. The radar signal may be sampled at a sample rate, and the parallel data streams 24, 26, 28, 30 may operate at a clock rate of the FPGA. The clock rate may be a fraction of the sample rate. The digital values of the serial data stream 22 may comprise a number of bits, such as 16 bits, and the parallel data streams 24, 26, 28, 30 may each include a series of data words having a number of bits, such as 16-bit data words. The FD filter may output a same number of bits as the number of bits received from the serial data stream 22 every clock cycle of the FPGA. As discussed above, in some embodiments the sample rate may be 1 GS/s and the clock rate may be 250 MHz.

Referring to step 102, each of the parallel data streams 24, 26, 28, 30 may be filtered via a Farrow-structured FD filter. The filter may comprise a plurality of FIR filters and FD gain elements. Each of the FIR filters may receive the parallel data streams 24, 26, 28, 30. The FIR filters may be configured to receive the corresponding data stream 24, 26, 28, 30 and filter the corresponding data stream 24, 26, 28, 30. As discussed above and depicted in FIG. 2, the parallel data streams 24, 26, 28, 30 have a time-order wherein at each clock cycle the data streams 24, 26, 28, 30 output digital samples in an order that the samples were taken and converted by the ADC. Values in the data streams 24, 26, 28, 30 may therefore precede and/or be subsequent to other data streams 24, 26, 28, 30. The filtering, via the FIR filters, may comprise receiving a current value from one of the data streams 24, 26, 28, 30; receiving a number of values preceding the current value according to the time order; and producing a weighted version of the current value based on the preceding values. The weight given the preceding values for each FIR filter may be predetermined via equations (1)-(4), as discussed above. This step 102 may also include passing each output of the FIR filters through an FD gain element configured to multiply the output with a value representative of a fractional delay resulting in a delayed output. The delayed output may be added to an output of one of the FIR filters.

Referring to step 103, values from one or more of the parallel data streams 24, 26, 28, 30 may be temporarily stored so that the stored values can be used to filter one or more of the parallel data streams 24, 26, 28, 30 having values that are, according to the time order, subsequent to the stored values. This step 103 may include sending the delayed data stream 64, 66, 68 to the FIR filters corresponding to any parallel data stream 24, 26, 28, 30 that precedes the one or more data stream that was delayed 26, 28, 30. This enables the FIR filters to weight current digital samples with preceding samples.

The method 100 may include additional, less, or alternate steps and/or device(s), including those discussed elsewhere herein.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A processing element for implementation in a digital signal processing system, the processing element configured to:
receive a first digital serial data stream comprising a plurality of samples of a radar signal;
convert the first digital serial data stream into a plurality of parallel data streams comprising time-ordered digital values;
store one or more of the digital values; and
weight each of the digital values consistent with a Farrow structured fractional delay filter using the plurality of digital values and one or more previously stored values to produce a plurality of filtered time-ordered digital values.

2. The processing element of claim 1, further configured to convert the plurality of filtered time-ordered digital values into an output serial data stream comprising the filtered time-ordered digital values in their time order.

3. The processing element of claim 1, wherein the radar signal is sampled at a sample rate that is faster than a clock rate of the processing element.

4. The processing element of claim 3, wherein a clock rate corresponding to the clock cycle is a fraction of a sample rate corresponding to the sample cycle.

5. The processing element of claim 1, wherein the number of plurality of filtered time-ordered digital values produced each clock cycle is equal to the number of plurality of time-ordered digital values received each clock cycle.

6. The processing element of claim 1, wherein the digital values consistent with the Farrow structured fractional delay filter include one or more sets of coefficients consistent with finite impulse response filters with fractional delay gains.

7. The processing element of claim 6, wherein the fractional delay gain represents a delay that is a fraction of a clock cycle of the processing element.

8. The processing element of claim 1, wherein the processing element is configured to store one or more of the digital values for a clock cycle of the processing element.

9. The processing element of claim 8, wherein the Farrow structured fractional delay filter has an order of N, and the processing element is configured to store N−1 of the digital values.

10. A processing element for implementation in a digital signal processing system, the processing element configured to:
(a) receive a plurality of parallel, time-ordered data streams, each of the data streams comprising one of a plurality of recent digital values representing samples of a radar signal;
(b) weight each of the digital values with one or more of their corresponding preceding digital values using a first set of coefficients consistent with a finite impulse response (FIR) filter to produce a first set of sums;
(c) multiply the first set of sums by a value representative of a fractional delay to produce a first set of products;
(d) weight the digital values with their corresponding preceding digital values using a second set of coefficients consistent with the FIR filter to produce a second set of sums;
(e) add the second set of sums with the first set of products to produce a third set of sums;
(f) multiply the third set of sums by the value representative of the fractional delay to produce a second set of products;
(g) repeat steps (d) through (f) one or more times using a remaining sets of coefficients consistent with the FIR filter to produce a final set of products; and
(h) add the final set of products with their corresponding digital values to produce a plurality of output values.

11. The processing element of claim 10, further configured to convert the plurality of output values into an output serial data stream.

12. The processing element of claim 10, further configured to convert an input serial data stream into the plurality of parallel, time-ordered data streams.

13. The processing element of claim 10, wherein the FIR filter has an order of N, and the one or more preceding values comprises N−1 preceding values.

14. The processing element of claim 10, wherein the number of output values produced is equal to the number of recent digital values received each clock cycle of the processing element.

15. A digital processing system comprising:
an analog-to-digital converter configured to receive a first analog signal from a radar device and convert the first analog signal to a first digital serial data stream comprising a sequence of digital values representing samples of the analog signal;
a processing element configured to:
(a) convert the digital serial data stream into M parallel, time-ordered data streams, each of the data streams comprising one of M digital values representing a most recent M samples;
(b) weight the M digital values with their preceding N−1 digital values using a first set of coefficients consistent with a finite impulse response (FIR) filter with an order of N to produce a first set of M sums;
(c) multiply the first set of M sums by a value representative of a fractional delay to produce a first set of M fractionally-delayed products;
(d) weight the M digital values with their preceding N−1 digital values using a second set of coefficients consistent with the FIR filter to produce a second set of M sums;
(e) add the second set of M sums with the first set of M fractionally-delayed products to produce a third set of M sums;
(f) multiply the third set of M sums by the value representative of the fractional delay to produce a second set of M fractionally-delayed products;
(g) repeat steps (d) through (f) N−2 times with remaining sets of coefficients consistent with the FIR filter to produce an Nth−1 set of M fractionally-delayed products;
(h) add the Nth−1 set of M fractionally-delayed products with their corresponding M digital values to produce output values; and
(i) output a second digital output stream comprising the output values; and
a digital-to-analog converter configured to convert the second digital output stream into a second analog signal.

* * * * *